United States Patent
Lim et al.

(10) Patent No.: US 8,492,822 B2
(45) Date of Patent: Jul. 23, 2013

(54) METHOD OF MANUFACTURING LC CIRCUIT AND LC CIRCUIT

(75) Inventors: Jin-Sung Lim, Suwon-si (KR); Chul-Ho Chung, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 388 days.

(21) Appl. No.: 12/659,446

(22) Filed: Mar. 9, 2010

(65) Prior Publication Data
US 2010/0230381 A1    Sep. 16, 2010

(30) Foreign Application Priority Data

Mar. 11, 2009   (KR) .................. 10-2009-0020831

(51) Int. Cl.
*H01L 27/108* (2006.01)
*H01L 29/94* (2006.01)

(52) U.S. Cl.
USPC ........... 257/303; 257/304; 257/305; 257/306; 257/307; 257/532; 257/535; 438/381

(58) Field of Classification Search
None
See application file for complete search history.

(56) References Cited

U.S. PATENT DOCUMENTS

2005/0051870 A1 * 3/2005 Yamazaki et al. ............ 257/531
2007/0275506 A1 * 11/2007 Yamazaki et al. ............ 438/118

FOREIGN PATENT DOCUMENTS

| JP | 08-330517 A | 12/1996 |
| KR | 10-0275541 B1 | 9/2000 |
| KR | 10-2004-0059402 A | 7/2004 |

* cited by examiner

*Primary Examiner* — Duy Deo
(74) *Attorney, Agent, or Firm* — Lee & Morse, P.C.

(57) ABSTRACT

A method for manufacturing an LC circuit, including forming a first conductive layer pattern serving as a lower electrode of a capacitor on a first interlayer insulating layer, forming a dielectric layer pattern storing electric charges on the first conductive layer pattern, forming a second conductive layer pattern serving as an upper electrode of the capacitor on the dielectric layer pattern, forming a second interlayer insulating layer on the second conductive layer pattern, forming a contact via exposing one of the first or second conductive layer pattern in the second interlayer insulating layer, and filling the contact via with a contact plug, and forming a third conductive layer pattern on the second interlayer insulating layer having the contact plug, wherein the third conductive layer pattern is electrically connected to the contact plug, and is etched in a metal interconnection type layer and functions as an inductor.

19 Claims, 4 Drawing Sheets

METHOD OF MANUFACTURING LC CIRCUIT AND LC CIRCUIT

BACKGROUND

1. Field

Exemplary embodiments relate to a method of manufacturing an LC circuit, which forms a metal-insulator-metal (MIM) capacitor under a metal-interconnection type inductor coil to use a MIM top routing metal as the inductor coil, and more specifically, to a method for manufacturing an LC circuit, which includes installing a capacitor under an inductor to reduce the overall area of a radio-frequency integrated circuit (RF IC) in which passive elements such as inductors and capacitors occupy the largest area. The capacitor is formed in such a manner that the width of metal interconnections of the inductor is equal to or smaller than that of the MIM capacitor, in order for the capacitor not to degrade the characteristics of the inductor.

2. Description of Related Art

As the paradigm of the information communication field changes, a communication scheme independent of time and place is being demanded. A wireless communication field is the most suitable field for such a demand, and has been rapidly developing. With the development of wireless communication, radio-frequency resources are needed, and demand for materials, elements, and circuits operating at radio frequencies is increasing. Since they are used at radio frequencies, they are generally classified into RF parts and ICs.

The RF IC technology may be accomplished through a combination of device manufacture technology, circuit design technology and radio-frequency package technology. In order to develop competitive RF-CMOS devices, the respective technologies should develop harmoniously. The RF-CMOS devices mainly include a RF metal oxide semiconductor field effect transistor (RF MOSFET), an inductor, a varactor, a capacitor, and a resistor.

In particular, the inductor may be used for constructing a radio frequency chip, but may occupy the largest portion of the area of the radio frequency chip as a single device. The inductor may be formed in a rectangular type, octagonal type, or circular type. The inductance of the inductors may be improved more or less depending on the shapes thereof. However, it is difficult to deny that the inductor occupies a large area in the radio frequency chip, regardless of which shape the inductor has.

SUMMARY

Embodiments are therefore directed to LC circuits and methods of manufacturing an LC circuit, which substantially overcome one or more of the problems due to the limitations and disadvantages of the related art.

It is therefore a feature of an embodiment to provide a method of manufacturing an LC circuit, in which an occupation area of the LC circuit may be reduced while capacitance per unit area may be increased.

It is therefore a separate feature of an embodiment to provide a method of manufacturing an LC circuit by which a manufacturing time and/or a manufacturing cost may be reduced as compared to comparable conventional methods.

It is therefore a separate feature of an embodiment to provide a capacitor and an inductor that occupy a relatively smaller chip area as compared to comparable conventional devices.

It is therefore a separate feature of an embodiment to provide a method of manufacturing an LC circuit in which when a top routing metal is formed in a MIM capacitor, it is manufactured in a metal interconnection type in order to reduce a size of an inductor and a capacitor within the same area, and the metal interconnection may be exclusively used as an inductor coil.

It is therefore a separate feature of an embodiment to provide a method of manufacturing an LC circuit in which a width and a length of a MIM capacitor may be properly adjusted in accordance with an environment of an inductor such that the capacitor does not have an effect on a flow of a magnetic field generated from the inductor and a characteristic of the inductor is not degraded by the capacitor.

At least one of the above and other features and advantages may be realized by providing a method for manufacturing an LC circuit, including forming a first conductive layer pattern serving as a lower electrode of a capacitor on a first interlayer insulating layer, forming a dielectric layer pattern storing electric charges on the first conductive layer pattern, forming a second conductive layer pattern serving as an upper electrode of the capacitor on the dielectric layer pattern, forming a second interlayer insulating layer on the second conductive layer pattern, forming a contact via exposing one of the first or second conductive layer pattern in the second interlayer insulating layer, and filling the contact via with a contact plug, and forming a third conductive layer pattern on the second interlayer insulating layer having the contact plug, wherein the third conductive layer pattern is electrically connected to the contact plug, and is etched in a metal interconnection type layer and functions as an inductor.

The third conductive pattern may be arranged in a planar spiral type pattern including a plurality of bent portions and a crossed portion, when seen from a plan view.

The third conductive pattern may be multi-turned in a substantially circular octagonal coil type pattern on one plane in a region excluding the crossed portion.

The first and second conductive layer patterns may overlap each other in a widthwise direction thereof.

The first conductive layer pattern may extend farther than the second conductive layer pattern in a widthwise direction thereof.

The contact via may include a first contact via which is formed by dry etching to expose a surface of the first conductive layer pattern and a second contact via which is formed to expose a surface of the second conductive layer pattern.

The upper and lower electrodes may include TiN, aluminum, and/or metal silicide.

The dielectric layer may include $SiO_2$, SiOF, and/or $Si_3N_4$.

The capacitor may have a metal-insulator-metal (MIM) structure.

At least one of the first and/or second conductive pattern may have a width equal to that of the third conductive layer pattern such that a flow of a magnetic field generated from the inductor is unaffected by the capacitor.

At least one of the first and/or second conductive pattern may have a width smaller than that of the third conductive layer pattern such that a flow of a magnetic field generated from the inductor is unaffected by the capacitor.

The second conductive layer pattern may be formed to extend over an overall length of the third conductive layer pattern in a lengthwise direction thereof.

The second conductive layer pattern may be formed only at a predetermined portion of the third conductive layer pattern based on inductance and capacitance values.

At least one of the above and other features and advantages may be separately realized by providing an LC circuit, including a first conductive layer pattern on a first interlayer insulating layer, the first conductive layer pattern adapted to server as a lower electrode of a capacitor, a dielectric layer pattern on the first conductive layer pattern, the dielectric layer pattern adapted to store electric charges, a second conductive layer pattern on the dielectric layer pattern, the second conductive layer pattern adapted to serve as an upper electrode of the capacitor, a second interlayer insulating layer on the second conductive layer pattern, a contact via extending through the second insulating layer and contacting one of the first or second conductive layer patterns, the contact via being filled with a contact plug, and a third conductive layer pattern defined in a metal interconnection type layer on the second interlayer insulating layer having the contact plug, wherein the third conductive layer pattern is electrically connected to the contact plug, the third conductive layer pattern being an inductor.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0020831, filed on Mar. 11, 2009, in the Korean Intellectual Property Office, and entitled: "Method of Manufacturing LC Circuit," is incorporated by reference herein in its entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. Like reference numerals refer to like elements throughout the specification. It will also be understood that when an element, e.g., layer, film, is referred to as being "on" or "above" another element, it can be directly on or above the other element, or intervening elements may also be present. It will also be understood that when an element is referred to as being "below" or "under" another element, it can be directly below or under the other element, or intervening elements may also be present. In addition, it will also be understood that when an element is referred to as being "between" two elements, it can be the only element between the two elements, or one or more intervening elements may also be present. As used herein, the term "and/or" includes any and all combinations of one or more of the associated listed items. Further, as used herein, the singular forms "a," "an" and "the" are intended to include the plural forms as well, unless the context clearly indicates otherwise.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of exemplary embodiments.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending on the functionality/acts involved.

In order to more specifically describe example embodiments, various aspects will be described in detail with reference to the attached drawings. However, the present inventive concept is not limited to example embodiments described.

Hereinafter, a method of manufacturing an LC circuit according to example embodiments will be described with reference to the accompanying drawings.

Passive elements including capacitors C, resistors R, and inductors L are being widely used in various electronic apparatuses. In a general electronic apparatus, a component proportion of passive elements is higher than that of active elements. However, while integration of the active elements is usually accomplished, integration of the passive elements is scarcely accomplished. Although the passive elements are not integrated, the integration of the passive elements is not strongly demanded, because the prices of individual passive elements are low. However, electronic apparatuses such as mobile phones, personal digital assistants (PDAs), global positioning system (GPS) receivers, and Bluetooth devices, which have a small size and multiple functions, require a large quantity of passive elements corresponding to communication schemes, communication frequencies, communication channel frequencies and so on. When the passive elements are implemented as individual devices, they may occupy a large volume, which becomes a considerable obstacle to the integration of passive elements.

Among the passive elements, an inductor L and a capacitor C occupy the largest area. Therefore, when the capacitor C and the inductor L are implemented on the same plane, a chip area inevitably increases.

Figure 1:
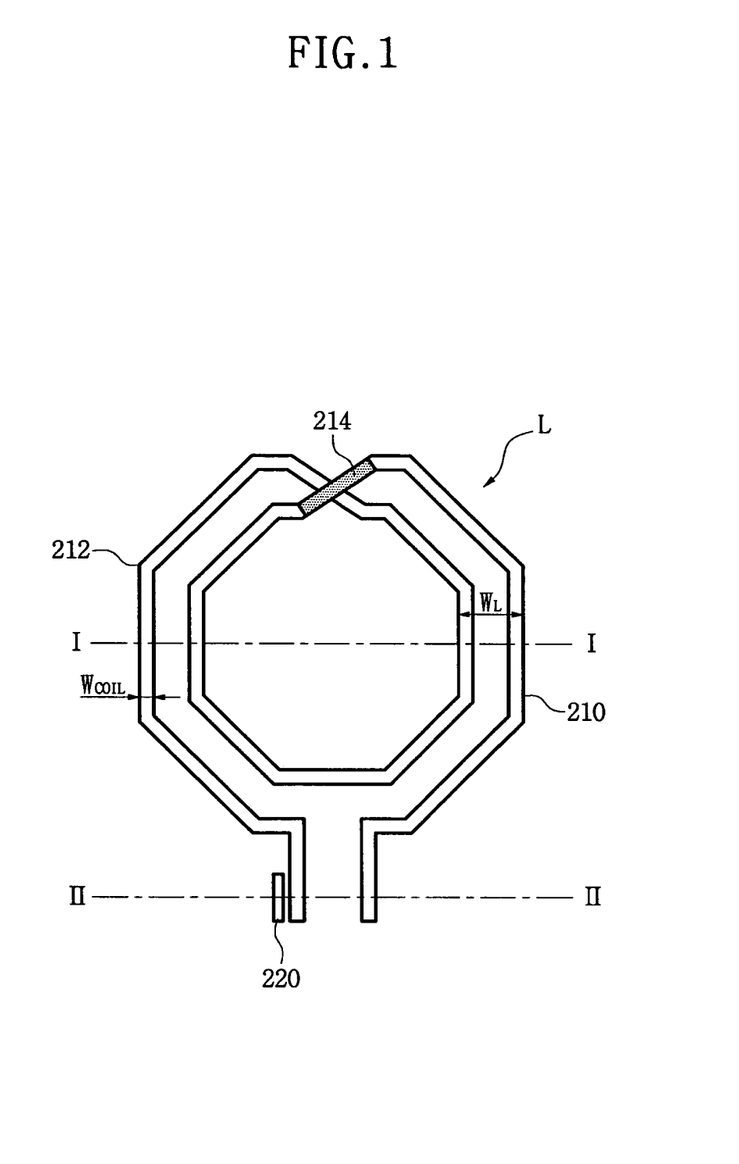
FIG. 1 illustrates a plan view of an exemplary configuration of an LC circuit.
Figure 2:
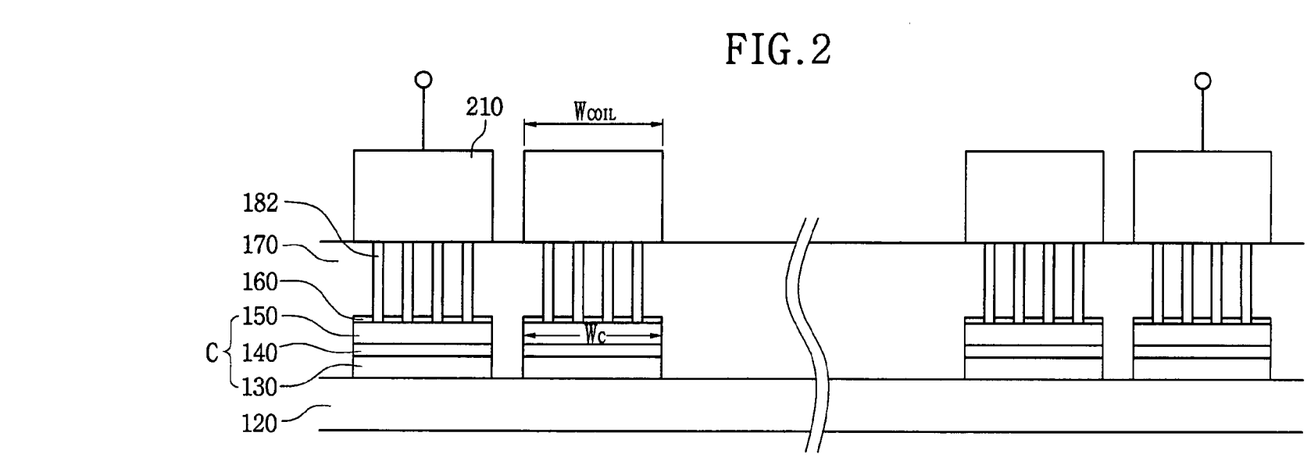
FIG. 2 illustrates a cross-sectional view of the exemplary LC circuit of FIG. 1, taken along line I-I of FIG. 1.
Figure 3:
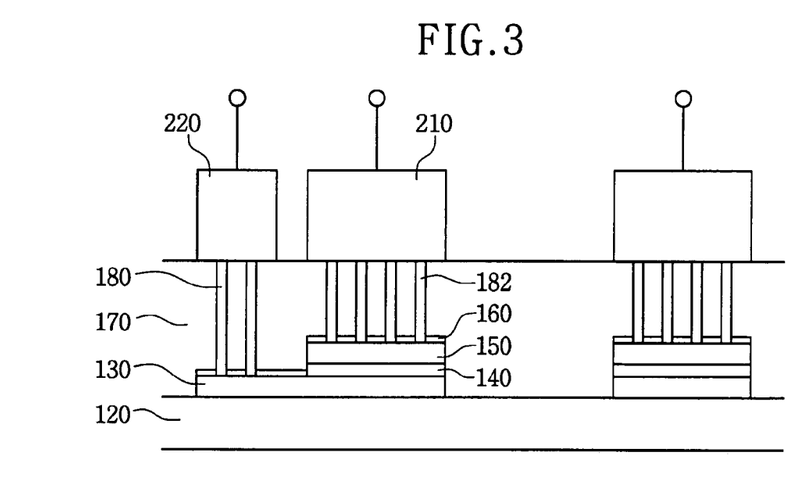
FIG. 3 illustrates a cross-sectional view of the exemplary LC circuit of FIG. 1, taken along line II-II of FIG. 1.

A coupled structure of a capacitor C and an inductor L, which reduces a chip area, according to example embodiments will be described with reference to FIGS. 1 to 3. FIG. 1 illustrates a plan view of an exemplary configuration of an LC circuit. FIG. 2 illustrates a cross-sectional view of the exemplary LC circuit of FIG. 1, taken along line I-I of FIG. 1. FIG. 3 illustrates a cross-sectional view of the exemplary LC circuit of FIG. 1, taken along line II-II of FIG. 1.

As shown in FIGS. 2 and 3, the exemplary LC circuit may include a first interlayer insulating layer 120, a first conductive layer pattern 130, a dielectric-layer pattern 140, a second conductive layer pattern 150, an etch stop layer 160, a second interlayer insulating layer 170, first contact plugs 180, second contact plugs 182, a metal interconnection coil 210, bent portion 212, crossed portion 214, and input and output terminal 220.

The first interlayer insulating layer 120 may be formed using chemical vapor deposition (CVD) using, e.g., a low-k $SiO_2$ or SiOF.

First, an exemplary structure of a capacitor C of the LC circuit will be described below. The capacitor C may include the first conductive layer pattern 130, the dielectric pattern 140, and the second conductive layer pattern 150. More particularly, e.g., for the capacitor C, a polysilicon/insulator/polysilicon (PIP) capacitor, a metal/insulator/silicon (MIS), a metal/insulator/metal (MIM) capacitor may be provided, depending on the electrode materials being employed. Thin film capacitors, e.g., PIP capacitor and MIM capacitor may be more commonly employed in analog semiconductor devices, which generally require precise capacitance values, because such capacitors, e.g., PIP capacitor, MIM capacitors, are independent of bias as compared to metal oxide semiconductor (MOS) capacitors or junction capacitors.

Referring to FIGS. 1-3, the first conductive layer pattern 130 may serve as a lower electrode of the capacitor C and may be formed on the first interlayer insulating layer 120.

The dielectric-layer pattern 140 may store electric charges of the capacitor C and may be formed on the first conductive layer pattern 130. The second conductive layer pattern 150 may serve as an upper electrode of the capacitor C and may be formed on the dielectric-layer pattern 140. The second interlayer insulating layer 170 may be formed on the first interlayer insulating layer 120 including the first and second conductive layer patterns 130 and 150.

As shown in FIG. 3, the first contact plug 180 may be electrically connected to the first conductive layer pattern 130 and may pass through a portion of the second interlayer insulating layer 170. The second contact plug 182 may be electrically connected to the second conductive layer pattern 150 and may pass through another portion of the second interlayer insulating layer 170.

As shown in FIG. 2, the first conductive layer pattern 130 and the second conductive layer pattern 150 may overlap each other. In some embodiments, the first conductive layer pattern 130 and the second conductive layer pattern 150 may have a same size and/or a same shape. The second conductive layer pattern 150 may be superimposed on, e.g., completely overlap with, the first conductive layer pattern 130. However, the first conductive layer pattern 130 and the second conductive layer pattern 150 may be different in size in shape from each other. For example, referring to FIG. 3, the first conductive layer pattern 130 may be larger than the second conductive layer pattern 150, but the second conductive layer pattern 150 may completely overlap with a portion of the first conductive layer pattern 130, e.g., the first conductive layer pattern 130 may extend beyond the second conductive layer pattern 150 such that a portion of the first conductive layer pattern 130 is not overlapping with the second conductive layer pattern 150.

The etch stop layer 160 may be formed on the second conductive layer pattern 150. The etch stop layer 160 may be employed in order to control an etching depth.

The first and second conductive layer patterns 130 and 150 may be formed by deposition, e.g., deposition of TiN. Embodiments are not limited thereto. For example, the first and/or second conductive layer patterns 130, 150 may include other materials such as aluminum, metal silicide, polycrystalline silicon doped with impurities, etc., may be used. The dielectric-layer pattern 140 may be formed by the deposition of SiN, e.g., $Si_3N_4$. Embodiments are not limited thereto. For example, the dielectric-layer pattern 140 may include $SiO_2$, SiON, AlO, TaO, etc.

Therefore, as shown in FIG. 3, when the first and second conductive layer patterns 130 and 150 are electrically connected through the first and second contact plugs 180 and 182, respectively, electric charges are stored in the dielectric-layer pattern 140 provided between the first and second conductive layer patterns 130 and 150, and the capacitor C may be formed.

Next, the structure of an inductor L according to exemplary embodiments will be described.

When the inductor L is composed of multiple layers, high integration of semiconductor devices may be implemented. However, the manufacturing process thereof may be complicated, and the manufacturing cost may increase.

In the exemplary embodiment of FIGS. 2 and 3, the inductor L is formed as a single layer and in as planar a manner as possible. More particularly, e.g., the inductor L may have a symmetrical structure along a plane. Such a plane-symmetrical structure for the inductor L may serve to secure a high quality factor without loss of inductance.

More particularly, e.g., the inductor L may have a structure in which, e.g., a circular spiral type coil is multi-turned on one plane or as shown in FIG. 1, symmetrical coils are crossed and multi-turned on one plane. In some embodiments, as the circular spiral type coil may be more difficult to manufacture, the coil may be formed in straight a straight line shape, e.g., line segments. Further, e.g., a nearly circular octagonal type multi-turn structure may be employed rather than, e.g., a rectangular type multi-turn structure. In particular, if the coil has a circular shape when the capacitor C is formed under the inductor L, patterns of the capacitor may become relatively more complex.

Now, a structure in which the capacitor C is formed under the inductor L according to exemplary embodiments will be described.

The capacitor C should not interfere with the characteristics of the inductor L. The capacitor C may be installed under the inductor L. The capacitor C may have a width We equal to or smaller than a width $W_{COIL}$ of the coil 210 of the inductor L. This is because when the capacitor C is installed under the coil 210 of the inductor L, the capacitor C does not have an effect on a flow of a magnetic field of the inductor L, and thus, on the performance of the inductor L. In particular, an intensity of the magnetic field may be the strongest at the center of the coil 210. Therefore, when the capacitor C is installed at the center of the coil 210, the capacitor C may distort a flux of the magnetic field, and may thereby degrade frequency characteristics.

Further, the capacitor C may be installed to correspond to a lower portion of the coil 210 of the inductor L. In this case, the capacitor C may be installed to extend over the overall length of the coil 210 of the inductor L, or only over a predetermined portion of the coil 210. More particularly, e.g., with regard to the exemplary structure of the inductor L illustrated in FIG. 1, the capacitor C may be arranged below the inductor L and within the width $W_L$ of the inductor L, and the capacitor C may also extend only a portion of and/or completely around a length of coil 210 of the inductor L. Thus, in some embodiments including the inductor L having the exemplary octagonal shape illustrated in FIG. 1, the capacitor C may also have an octagonal shape. Referring to FIG. 2, the capacitor C may have a width $W_C$ that is equal to or less than the width $W_{COIL}$ of the coil 210. In the'LC circuit according to exemplary embodiments, the MIM capacitor may be formed below the coil 210 used as the inductor L, or below a predetermined portion of the coil 210 of the inductor L. Therefore, the structure may be widely applied to filters and matching circuits. More particularly, the arrangement may be determined depending on various requests of a designer, in consideration of inductance and capacitance values. As a result, it is possible to improve the overall characteristics of the LC circuit.

Finally, a method of manufacturing an LC circuit by forming a MIM capacitor under a metal-interconnection type inductor according to exemplary embodiments will be described in detail. FIGS. 4-9 illustrate cross-sectional views of stages in the exemplary method of forming the exemplary LC circuit as illustrated in FIG. 3.

Figure 4:
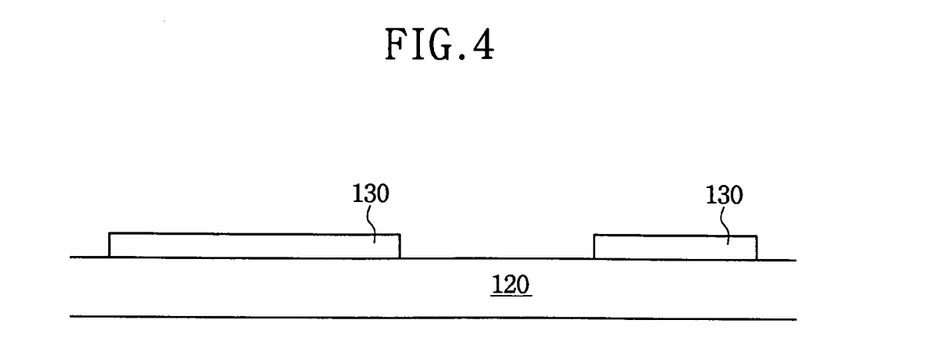
FIG. 4 illustrates a cross-sectional view of a stage during which a first conductive layer pattern is formed on a first interlayer insulating layer according to an exemplary method of forming the LC circuit as illustrated in FIG. 3.

FIG. 4 illustrates a cross-sectional view of a stage during which the first conductive layer pattern 130 is formed on the first interlayer insulating layer 120 according to an exemplary method of forming the LC circuit as illustrated in FIG. 3. Referring to FIG. 4, a first conductive layer (not shown) may be formed on the first interlayer insulating layer 120, and may be patterned to form the first conductive layer pattern 130. More particularly, the first conductive layer pattern 130 may include a plurality of pattern portions. The first conductive layer pattern 130 may be formed using, e.g., a metal such as aluminum, polycrystalline silicon doped with impurity ions, metal silicide, etc. The first interlayer insulating layer 120 may include, e.g., $SiO_2$. More particularly, e.g., the first interlayer insulating layer 120 may be formed using a combination of silicon particles and oxygen particles. In some other exemplary embodiments, the first interlayer insulating layer 120 may be a thermal oxide layer, which may be formed by a thermal process or wet oxidation process. As shown in FIG. 4, a photolithography process may be performed on the first conductive layer 120, and may form one or more of the first conductive layer patterns 130, which may serve as lower electrodes of capacitors C.

Figure 5:
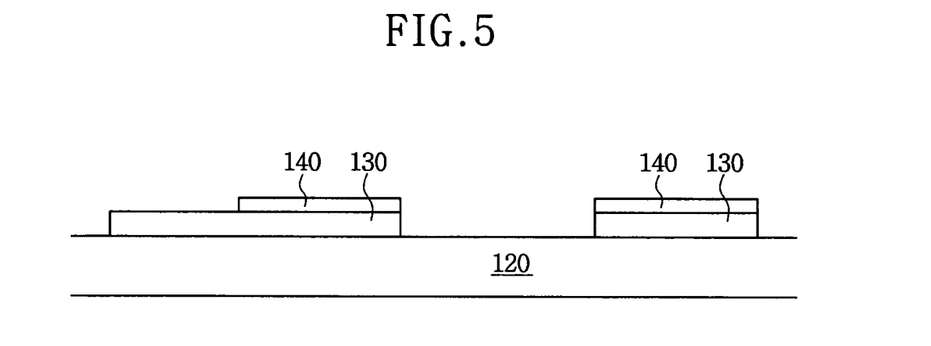
FIG. 5 illustrates a cross-sectional view of a stage during which dielectric patterns are formed on the first conductive layer patterns according to an exemplary method of forming the LC circuit as illustrated in FIG. 3.

FIG. 5 illustrates a cross-sectional view of a stage during which the dielectric layer patterns 140 may be formed on the first conductive layer patterns 130 according to an exemplary method of forming the LC circuit as illustrated in FIG. 3. A dielectric layer (not shown) including, e.g., SiN, $SiO_2$, SiON, AlO, TaO, etc., may be deposited on the first conductive layer patterns 130. As shown in FIG. 5, the dielectric layer patterns 140 may be formed on the first conductive layer patterns 130 through a photolithography process. The dielectric layer patterns 140 may store an electric charge of the capacitor C.

Figure 6:
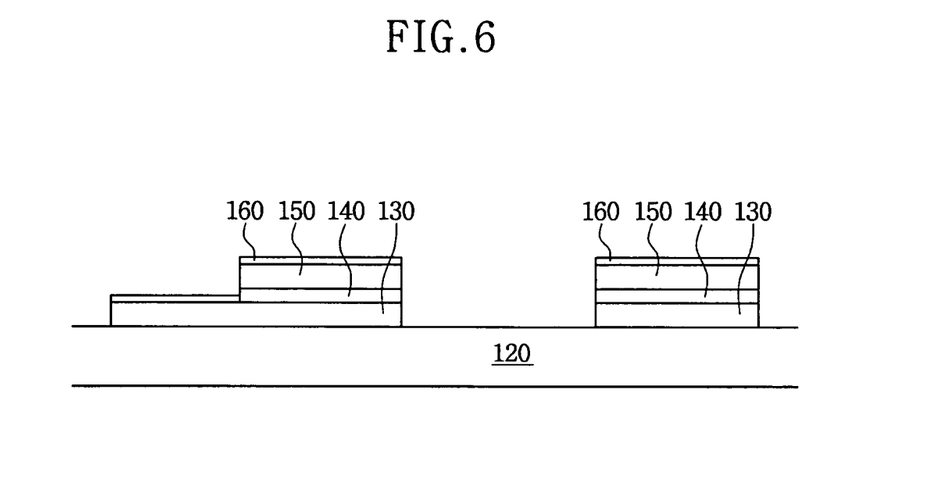
FIG. 6 illustrates a cross-sectional view of a stage during which second conductive layer patterns and etch stop layer patterns are formed on the dielectric layer patterns according to an exemplary method of forming the LC circuit as illustrated in FIG. 3.

FIG. 6 illustrates a cross-sectional view of a stage during which the second conductive layer patterns 150 and the etch stop layer patterns 160 may be formed on the dielectric layer patterns 140 according to an exemplary method of forming the LC circuit as illustrated in FIG. 3. A second conductive layer (not shown) may be deposited on the dielectric layer patterns 140 using a same material as the first conductive layer pattern 130. The second conductive layer may be patterned to form the second conductive layer patterns 150. More particularly, as shown in FIG. 6, a photolithography process may be performed on the second conductive layer to form the second conductive layer patterns 150, which may serve as upper electrodes. The second conductive layer pattern 150 may perfectly overlap the first conductive layer pattern 130, or partially overlap the first conductive layer pattern 130. As shown in FIG. 6, the etch stop layer patterns 160 may be formed on the second conductive layer patterns 150.

Figure 7:
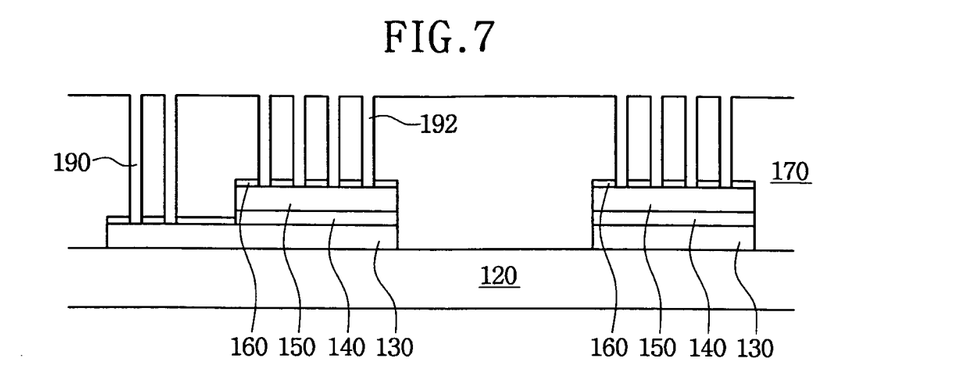
FIG. 7 illustrates a cross-sectional view of a stage during which a second interlayer insulating layer is deposited on the first interlayer insulating layer including the first and second conductive layer patterns and the dielectric layer patterns, and contact vias are formed according to an exemplary method of forming the LC circuit as illustrated in FIG. 3.

FIG. 7 illustrates a cross-sectional view of a stage during which the second interlayer insulating layer 170 is deposited on the first interlayer insulating layer 120 including the first and second conductive layer patterns 130, 150 and the dielectric layer patterns 140 thereon. As shown in FIG. 7, the second interlayer insulating layer 170 may be patterned to form a plurality of contact vias 190, 192. Referring to FIG. 7, the second interlayer insulating layer 170 may include, e.g., $SiO_2$, etc., may be formed on the etch stop layer patterns 160. On the second interlayer insulating layer 170, photoresist patterns (not shown) may be formed through a photolithography process, and contact vias 190, 192 may be formed in the second interlayer insulating layer 170 using the photoresist patterns as an etch mask. The first contact via 190 may be formed by dry etching to expose a surface of the first conductive layer pattern 130, and the second contact via 192 may be formed to expose a surface of the second conductive layer pattern 150.

Figure 8:
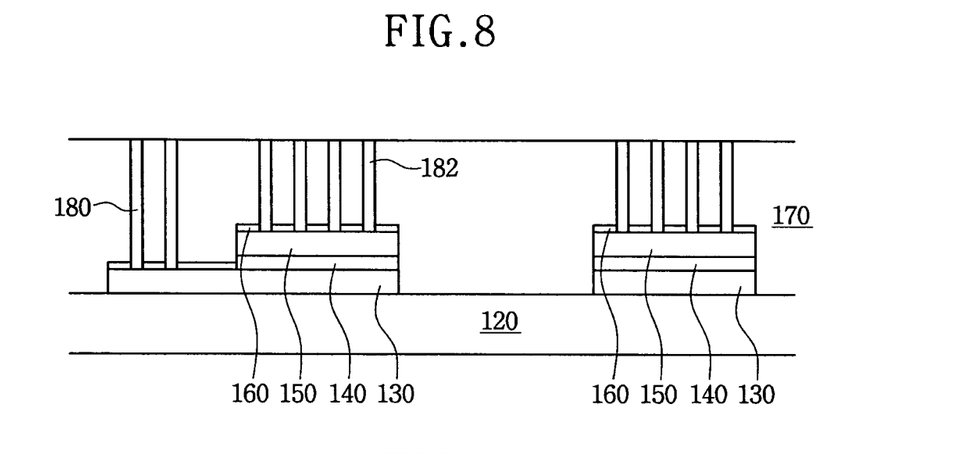
FIG. 8 illustrates a cross-sectional view of a stage during which the contact vias are filled with contact plugs, and planarization is performed according to an exemplary method of forming the LC circuit as illustrated in FIG. 3.

FIG. 8 illustrates a cross-sectional view of a stage during which the contact vias 190, 192 are filled with the contact plugs 180, 182, and planarization is performed according to an exemplary method of forming the LC circuit as illustrated in FIG. 3. As shown in FIG. 8, the first and second vias 190 and 192 may be filled with a conductive material, e.g., aluminum, tungsten, etc., and an upper portion of the second interlayer insulating layer 170 may be planarized. More particularly, the second interlayer insulating layer 170 may be planarized using, e.g., a chemical mechanical polishing (CMP) process. Then, the first and second contact plugs 180 and 182 may be formed in the second interlayer insulating layer 170.

Figure 9:
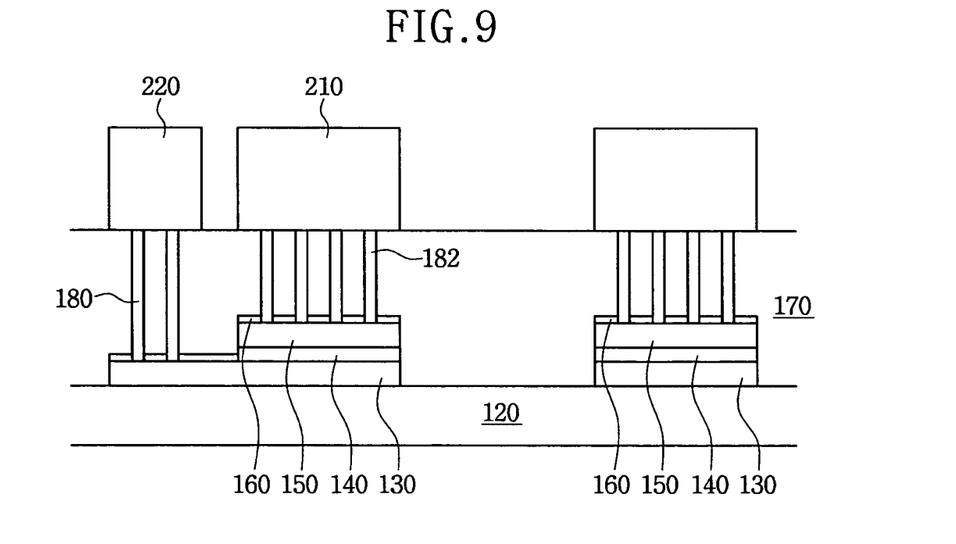
FIG. 9 illustrates a cross-sectional view of a stage during which a coil is formed on the second interlayer insulating layer according to an exemplary method of forming the LC circuit as illustrated in FIG. 3.

FIG. 9 illustrates a cross-sectional view of a stage during which the coil 21—is formed on the second interlayer insulating layer 170 according to an exemplary method of forming the LC circuit as illustrated in FIG. 3.

Although not shown, a third conductive layer, e.g., aluminum, tungsten, etc., may be deposited on the second interlayer insulating layer 170 having the first and second contact plugs 180 and 182 provided therein. Further, photoresist may be applied onto the third conductive layer, and an exposure process using a photomask and a developing process may be sequentially performed to form photoresist patterns. Using the photoresist patterns as an etch mask, the third conductive layer may be etched. Then, as shown in FIG. 9, third conductive layer patterns may be formed and may include a metal-interconnection type coil 210 and an input/output terminal 220, which may correspond to the inductor L.

As shown in FIG. 1, the coil 210 may be formed in a metal interconnection type layer, and may have a planar spiral structure in which the plurality of bent portions 212 and the crossed portion 214 may be provided in the metal interconnection, when seen from the plan view. In particular, the MIM capacitor may have a top routing metal installed between the contact plugs 180 and 182 in order to connect with a circuit. In this case, the coil 210 of the inductor L, e.g., the metal interconnection, may be used as the top routing metal. The top routing metal may be installed, e.g., in the entire region excluding the bent portions 212 and the crossed portion 214.

As such, the inductor L occupying the largest area among passive elements may be configured in such a manner that the inductance and the quality factor for determining a charge storing ability may be improved. The inductance may be determined by a length of the coil of the inductor L, and a quality factor may be influenced depending on a resistance component of the coil. In embodiments, because the capacitor C may be installed under the inductor L, a limitation of chip area may be eliminated, and a length of the coil 210 may be sufficiently extended. Further, the coil 210 may be formed to a large thickness.

In logic circuits of the RF IC, a chip size may continuously decrease as design rules are reduced. In passive elements, however, an absolute area occupied by an inductor L and a capacitor C may not decrease. In exemplary embodiments, in order to reduce an occupation area of the inductor and the capacitor occupying the largest area among the passive elements, the capacitor may be formed under the metal interconnection type inductor coil. In particular, the MIM capacitor may be adopted in order to exclusively use a metal interconnection as the coil of the inductor, and the metal interconnection may be favorable to high-speed and radio-frequency characteristics and used as a top routing metal. Since the capacitor may have an effect on a flow of a magnetic field generated from the inductor, the metal interconnection of the inductor may be formed in such a manner that the width thereof is equal to or smaller than that of the MIM capacitor. Further, in order to adjust the capacitance depending on the environment of the LC circuit, the capacitor may be formed to extend over the overall length of the inductor or only over a predetermined portion of the inductor.

In embodiments, by forming the capacitor under the inductor, it is possible to reduce an occupation area of the capacitor occupying the second largest area among passive elements. In embodiments, by forming the inductor in a substantially circular octagonal spiral type similar to a circle on one plane, a loss of inductance may be minimized, and patterning may be easily performed. In particular, the structure of the capacitor formed under the inductor may be simplified.

In embodiments, by providing the capacitor with a MIM structure, it may be suitable for high-speed and radio-frequency characteristics. In particular, the MIM capacitor may have a top routing metal installed at the upper end of the contact plug. As the metal interconnection of the inductor may be used as the top routing metal, the manufacturing process may be simplified, and the manufacturing cost may be reduced.

In embodiments, by providing the upper and lower electrodes of the MIM capacitor so as to have a width equal to or smaller than that of the metal interconnection of the inductor, the magnetic field of the inductor may not distorted by the capacitor.

In embodiments, as the MIM capacitor may be installed in accordance with the length of the metal interconnection of the inductor, and the length may be properly adjusted in consideration of capacitance. Therefore, it is possible to satisfy demands from various consumers.

The foregoing is illustrative of exemplary embodiments and is not to be construed as limiting thereof. Although a few exemplary embodiments have been described, those skilled in the art will readily appreciate that many modifications are possible in exemplary embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various exemplary embodiments and is not to be construed as limited to the specific embodiments disclosed, and that modifications to the disclosed embodiments, as well as other embodiments, are intended to be included within the scope of the appended claims.

What is claimed is:

1. A method for manufacturing an LC circuit, comprising:
forming a first conductive layer pattern serving as a lower electrode of a capacitor on a first interlayer insulating layer;
forming a dielectric layer pattern storing electric charges on the first conductive layer pattern;
forming a second conductive layer pattern serving as an upper electrode of the capacitor on the dielectric layer pattern;
forming a second interlayer insulating layer on the second conductive layer pattern, forming a contact via exposing one of the first or second conductive layer pattern in the second interlayer insulating layer, and filling the contact via with a contact plug; and
forming a third conductive layer pattern on the second interlayer insulating layer having the contact plug, wherein the third conductive layer pattern is electrically connected to the contact plug, and is etched as a metal interconnection type layer and functions as an inductor, the third conductive layer pattern being etched in a planar spiral pattern so that the third conductive layer pattern covers the second conductive layer pattern in a vertical direction.

2. The method as claimed in claim 1, wherein the planar spiral pattern includes a plurality of bent portions and a crossed portion, when seen from a plan view.

3. The method as claimed in claim 1, wherein the third conductive layer pattern is multi-turned in a substantially circular octagonal coil type pattern on one plane in a region excluding the crossed portion.

4. The method as claimed in claim 1, wherein the first and second conductive layer patterns overlap each other in a widthwise direction thereof.

5. The method as claimed in claim 1, wherein the first conductive layer pattern extends farther than the second conductive layer pattern in a widthwise direction thereof.

6. The method as claimed in claim 1, wherein the contact via includes a first contact via which is formed by dry etching to expose a surface of the first conductive layer pattern and a second contact via which is formed to expose a surface of the second conductive layer pattern.

7. The method as claimed in claim 1, wherein the upper and lower electrodes include TiN, aluminum, and/or metal silicide.

8. The method as claimed in claim 1, wherein the dielectric layer includes $SiO_2$, SiOF, and/or $Si_3N_4$.

9. The method as claimed in claim 1, wherein the capacitor has a metal-insulator-metal (MIM) structure.

10. The method as claimed in claim 1, wherein at least one of the first and/or second conductive layer pattern has a width equal to that of the third conductive layer pattern such that a flow of a magnetic field generated from the inductor is unaffected by the capacitor.

11. The method as claimed in claim 1, wherein at least one of the first and/or second conductive layer pattern has a width smaller than that of the third conductive layer pattern such that a flow of a magnetic field generated from the inductor is unaffected by the capacitor.

12. The method as claimed in claim 1, wherein the second conductive layer pattern is formed to extend over an overall length of the third conductive layer pattern in a lengthwise direction thereof.

13. The method as claimed in claim 1, wherein the second conductive layer pattern is formed only at a predetermined portion of the third conductive layer pattern.

14. A method for manufacturing an LC circuit, the method comprising:
forming a capacitor including a lower electrode, a dielectric layer and an upper electrode;
forming an interlayer insulating layer covering the capacitor;
forming a first contact via exposing the upper electrode of the capacitor in the interlayer insulating layer;
forming a first contact plug filling the first contact via; and
forming an inductor connected to the first contact plug on the interlayer insulating layer, the inductor being formed such that the inductor overlaps the capacitor in a vertical direction,
wherein forming the inductor includes forming a horizontal width of the inductor to be equal to or larger than a horizontal width of the capacitor.

15. The method as claimed in claim 14, wherein the capacitor and the inductor are both formed to have a planar spiral shape.

16. The method as claimed in claim 14, wherein forming the capacitor includes forming a width of the lower electrode to be greater than a width of the dielectric layer a width that of the upper electrode.

17. The method as claimed in claim 16, further comprising:
forming a second contact via exposing the lower electrode of the capacitor; and
forming a second contact plug filling the second contact via,
wherein forming the second contact via is performed together with forming the first contact via, and forming the second contact plug is performed together with forming the first contact plug.

18. The method as claimed in claim 17, further comprising forming an input/output terminal connected to the second contact plug on the interlayer insulating layer, wherein forming the input/output terminal is performed together with forming the inductor.

19. The method as claimed in claim 14, further comprising forming an etch stop layer pattern on the capacitor before forming the interlayer insulating layer.

* * * * *